United States Patent
Sakoh

(10) Patent No.: US 6,384,444 B2
(45) Date of Patent: May 7, 2002

(54) SEMICONDUCTOR DEVICE INCLUDING CAPACITIVE ELEMENT OF AN ANALOG CIRCUIT

(75) Inventor: Takashi Sakoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/729,799

(22) Filed: Dec. 6, 2000

(30) Foreign Application Priority Data

Dec. 6, 1999 (JP) .......................................... 11-346139

(51) Int. Cl.[7] .............................................. H01L 27/108
(52) U.S. Cl. ...................................... 257/303; 438/253
(58) Field of Search ................................ 257/303, 304, 257/306, 532; 438/253, 254, 257–259

(56) References Cited

U.S. PATENT DOCUMENTS

| | | | | |
|---|---|---|---|---|
| 4,811,076 A | * | 3/1989 | Tigelaar et al. | ............... 357/51 |
| 5,833,745 A | * | 11/1998 | Atsuki et al. | .......... 106/287.18 |
| 6,075,266 A | * | 6/2000 | Yoshitomi | ................... 257/306 |
| 6,242,299 B1 | * | 6/2001 | Hickert | ....................... 438/240 |

* cited by examiner

Primary Examiner—David Nelms
Assistant Examiner—Quoc Huang
(74) Attorney, Agent, or Firm—Sughrue Mion, PLLC

(57) ABSTRACT

Comparing with, for example, a semiconductor device having the configuration in which the logic circuit and the DRAM cell circuit are consolidated, a semiconductor device in which an analog capacity element is installed without substantially increasing the number of the steps is provided.

An analog capacity element to be installed in the DNA e11 circuit has a structure in which a lower electrode 5, a side-wall insulation film 9, and a bit line are formed using the same materials and the same patterns as those of a gate electrode 4, a dielectric film 10, and bit line, respectively.

7 Claims, 13 Drawing Sheets

Analog capacity part | DRAM cell part

Analog capacity part | DRAM cell part

Analog capacity part | DRAM cell part

Analog capacity part | DRAM cell part

Analog capacity part | DRAM cell part

Analog capacity part | DRAM cell part

SEMICONDUCTOR DEVICE INCLUDING CAPACITIVE ELEMENT OF AN ANALOG CIRCUIT

BACKGROUND OF THE INVENTION

1. Field of the Invention

The present invention relates to a semiconductor device that includes a capacity element for analog circuit, such as a semiconductor device with a structure in which a capacitance for analog circuit is added on a digital circuit, and a method for manufacturing such a device. More specifically, the present invention relates to a semiconductor device having a digital circuit, where a smaller capacity element (analog capacity element) of applied-voltage dependent is added on a DRAM-consolidated logic circuit having a DRAM mounted on a logic circuit, and a method for manufacturing such a device.

2. Description of the Related Art

In recent years, there is the growing need for configuring a semiconductor device to include a consolidated circuit with required circuit elements of two or more types on the same chip for accomplishing all functions. Examples of such a device are a product with a DRAM mounted logic circuit (DRAM-consolidated logic circuit) or a product with a flash-memory-mounted logic circuit (flash memory consolidated logic circuit), which is designed in many different types for its particular application or purpose.

Some DRAM-consolidated circuits require the formation of a capacity element with less applied-voltage dependency (analog capacity element) than that of DRAM cell capacitors in addition to an element to be used for structuring a digital circuit. The analog capacity element requires extremely less applied-voltage dependency than that of DRAM cell capacitors, so that a so-called MOS capacitor constructed of a silicon substrate and gate electrodes cannot be used as an analog capacity element because of its inherent voltage dependency. Regarding a capacitor that makes up a memory cell of DRAM, which has a thick capacity insulating film, for example as shown in FIG. 1, it cannot be used in an along capacity element because of its not enough small applied-voltage dependency.

For manufacturing some DRAM-consolidated logic circuits on which analog capacity elements are mounted, therefore, there is the need for forming a capacity element having a structure to be used in an analog circuit in addition to a general capacity element that makes up a digital circuit when the process.

For example, the element structure shown in a schematic diagram of FIG. 2 has been adapted in the DRAM-consolidated circuit product having the conventional analog capacity element. We will simply describe its manufacturing method and its configuration as follows. As shown in FIG. 2, an analog capacity element is configured as a MIM-type plate capacity element that is a capacity insulating film 10 sandwiched between a lower electrode 5 made of polysilicon and an upper electrode 12 made of polysilicon. For providing electric insulation with the other elements, for example, the lower electrode 5 is formed on a semiconductor substrate 1 having a diffusion layer region 3 and an element separation 2 so that the lower electrode 5 is formed on the same layer as that of the gate electrodes 4.

In a DRAM cell part, on the other hand, a bit line 11 is formed on an interlayer insulation film 8 and an accumulation electrode 14 is formed on a second interlayer insulation film 16 formed on a bit line 11. These electrodes in the DRAM cell part which are a bit line 11 and an accumulation electrode 14 are constructed on upper positions with respect to the analog capacity element. The DRAM cell capacitor consists of the accumulation electrode 14, a dielectric film 18 and the cell plate 19.

Next, we will briefly describe the process of forming the structure shown in FIG. 2 with reference to cross partial views of the respective steps in FIGS. 3 to 7.

At first, a silicon oxide film in thickness of about 7 nm as a gate insulating film 1a is layered on a silicon substrate 1 having an element separation 2 and a gate polysilicon film 15 in thickness of about 150 nm as a gate electrode 4 is layered on a silicon oxide film 1a. Subsequently, a silicon oxide film in thickness of about 50 nm to be used as a dielectric film 10 of an analog capacity element and, a doped polysilicon film in thickness of about 150 nm to be used as an upper electrode 12 are layered one after another. After that, both the doped polysilicon film provided as the top film and the silicon oxide film are subjected to the step of patterning, so that they are provided as the upper electrode 12 of the dielectric film 10 of the analog capacity element shown in FIG. 3.

Next, as shown in FIG. 4, the gate polysilicon film 15 is patterned to form a gate electrode 4 of a DRAM cell part and a lower electrode 5 of the analog capacity element, respectively. Then, the gate electrode 4 is used as a mask to form a diffusion layer region 3 by performing an ion-implantation of n-type impurity such as phosphorus into a source region.

Next, as shown in FIG. 5, an interlayer insulation film 8 that covers the formed analog capacity element is formed, such a manner that the insulation layer is layered entirely so as to be formed as one having a height of about 600 nm from the diffusion layer region 3 (about 250 nm from the top electrode 12). Subsequently, a connection hole 7 for obtaining an electrical connection between a bit line and the diffusion layer region 3 under the bit line by etching the interlayer insulation film 8 and the gate insulating film 1a.

After forming a side-wall insulation film 9 in the connection hole 7, as shown in FIG. 6, films, such as a doped polysilicon film having a thickness of about 100 nm at a flat surface thereof is formed on a full surface of the interlayer insulation film 8, and subsequently, for example, a tungsten silicide film in thickness of about 100 nm is formed thereon. The above connection hole 7 is filled with the doped polysilicon and tungsten silicide films, and then subjected to the step of patterning using a technology of photolithography to form a bit line 11 after removing undesired parts of the doped polysilicon and tungsten silicide films by means of etching.

Next, as shown in FIG. 7, the second interlayer insulation film 16 is formed on the interlayer insulation film 8 at a height of about 300 nm from the top of the bit line 11. For connecting between the accumulation electrode 14 and the diffusion layer region 3 provided as a under layer thereof, a capacitor connecting hole 17 cutting through the second interlayer insulation film 16 and the interlayer insulation film 8 is formed by means of etching. Therefore, the depth of the capacitor-connecting hole 17 is about 1,100 nm.

After that, a side-wall insulation film 13, such as one having a thickness of about 50 nm is formed on the above capacitor connecting hole 17, followed by entirely layering a phosphorus doped polysilicon film, such as one having a thickness of about 70 nm at a flat surface. The above capacitor connecting hole 17 is imbedded in the phosphorus doped polysilicon and then subjected to the steps of patterning and etching to perform the processing operation on the accumulation electrode 14. After that the dielectric film 18 of DRAM cells and the cell plate 19 are formed, obtaining the structure shown in FIG. 2.

Conventionally, like an element configuration as shown in FIG. 2, the manufacturing process are divided into two different processes, one is to form an analog capacity element and the other is to form a DRAM cell part after the first one. The analog capacity element and the DRAM cell part cannot be formed simultaneously, because the thickness of the analog capacity insulating film 10 must be thicker than that of the DRAM capacity insulating film 18. As a consequence, the number of steps is increased.

While a non-flat surface of the analog capacity element is obtained because of its projected portions, caused by a dielectric film 10 and an upper electrode 12 of the capacity element. Therefore, the patterning the resist before the etching the gate electrodes has troubles.

Besides, it greatly impairs the advantage of making the resist patterning before the gate etching easily by forming the structure of an element separation 2 so as to make a flat surface of the substrate. Therefore, it is desirable to be able to solve such problems and to provide, the element configuration that takes the advantage of selecting the structure of element separation that allows a flat surface of the substrate without substantially increasing the number of steps when the analog capacity element is added to the DRAM-consolidated logic circuit.

The present invention aims to solve the problems described above and the purpose of the present invention is to provide a semiconductor device that includes a capacity element for an analog circuit, for example to provide an element configuration allowing that there is no substantial increase in the number of the steps for a semiconductor device having the configuration in which a logic circuit and a DRAM cell circuit are consolidated together, on which an analog capacity element is installed, compared with a semiconductor device having the configuration in which a logic circuit and a DRAM cell circuit are consolidated together as an analog capacity element is installed. More concretely, the present invention aims to provide: an element configuration that allows the resist patterning step accompanying with the steps of forming films and etching the films at the time of forming a dielectric film and electrodes on the top and bottom of such a dielectric film without substantially increasing the number of the steps; and a method for manufacturing an analog capacity element having such an element configuration. Furthermore, the present invention aims to provide an element configuration that allows a structure of element separation to be mounted in the substrate without spoiling the advantage of a flat surface of the substrate.

SUMMARY OF THE INVENTION

The present inventors found that the possibilities of adapting a conductive material, which is utilized in the formation of a bit line or an accumulation electrode, as an upper electrode that constitutes an analog capacity electrode and also adapting a material, which is utilized for a dielectric film 10 that constitutes an analog capacity element as a side-wall insulating film 9 or a side-wall insulating film 13. Regarding the analog capacity element, furthermore, we found that the structure in which the analog capacity element is imbedded into the interlayer insulation film is not necessarily required for attaining no substantial differences in the operation characteristics of the semiconductor device itself as far as that ins insulated from the DRAM cell part. For example, a third insulation film that electrically isolates a side wall of an accumulation electrode is utilized for a capacitor portion of a DRAM cell is formed on a position above the second interlayer insulation film while an accumulation electrode is used as a lower electrode of the capacitor. We concluded that the electric isolation could be attained comparing favorably with the configuration of the analog capacitor element imbedded in the interlayer insulation film if the analog capacity element was covered with such a third insulation film.

As a result of inventing a new element configuration on the basis of the above findings, we found that the analog capacity element did not show its bias dependency of the capacitance without any difference in the characteristics of DRAM cell itself if the under electrode 5 of the analog capacity element is provided on the same layer as that of the gate electrode 4 of the DRAM cell, the dielectric film 10 of the analog capacity element is positioned on the same layer as that of the side-wall insulation film 9 of the DRAM cell provided on the connection hole side wall on which the bit line is formed or the side wall insulation membrane 13 of the DRAM cell provided on the capacitor connection hole side wall of the accumulation electrode, and the upper electrode 12 of the analog capacity element is provided on the same layer as that of the conductive material 11 used for the formation of bit line or the conductive material 14 used for the formation of accumulation electrode. In addition, we confirmed that the installation of analog capacity element became possible without a substantial increase in the number of the steps if the above configuration was adapted. Furthermore, we complete the present invention on the basis of our findings that the advantages of such a configuration could be applied in broader range of the applications for the semiconductor device including the analog capacity element.

BRIEF DESCRIPTION OF THE DRAWINGS

The above and other objects, advantages and features of the present invention will be more apparent from the following description taken in conjunction with the accompanying drawings, in which.

BRIEF DESCRIPTION OF THE PREFERRED EMBODIMENTS

Figure 1:
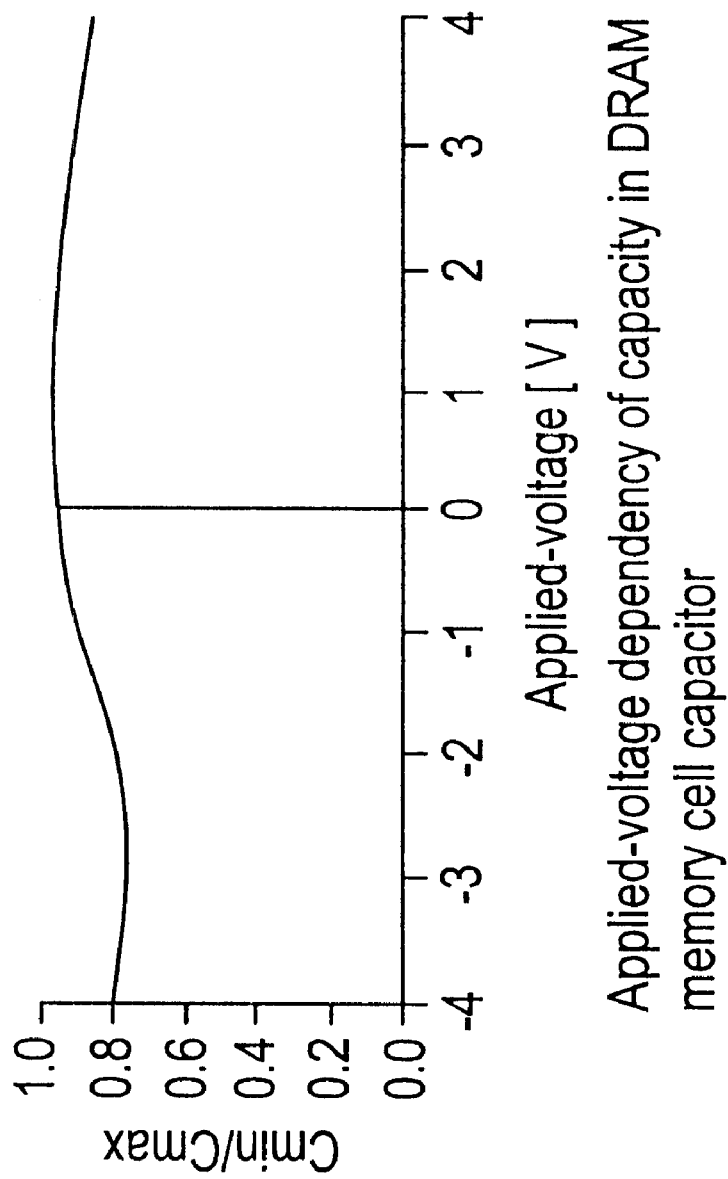
FIG. 1 is a graph showing a typical example of the applied-voltage dependency of a capacitor capacity of a DRAM memory cell.

A semiconductor device of the present invention is provided as a MIM structure comprised of a dielectric film 10 which is sandwiched between an upper electrode 12 and a lower electrode 5 from the upper and lower sides. An insulation material to be used as the dielectric film 10 may be utilized in, for example, a side-wall insulation film 9 that covers a side wall of a connection hole for a contact to be used for an electrical connection between a source electrode and a bit line of the DRAM cell, or a side-wall insulation film 13 that covers a side wall of a capacitor connection hole for a contact to be used for an electrical connection between a drain electrode and an accumulation electrode of the DRAM cell. Adapting such a configuration allows the formation of lower 5 and upper 12 electrodes of an analog capacity element through the use of: two conductive material layers selected from three conductive material layers used in a gate electrode 4, a bit line 11 and its contact, and an accumulation electrode 14 and its contact of the DRAM cell. Therefore, it is possible to add an analog capacity element part on a semiconductor device having a logic circuit embedded DRAM cell part by only changing a mask pattern to be involved in the processing of the shape of electrode of the analog capacity element without substantially increasing the number of steps in the manufacturing process.

Hereinafter, we will concretely describe the configuration of a semiconductor device and a method for manufacturing such a device in accordance with the present invention in reference to the figures with an example of the configuration in which an analog capacity element part is installed on a semiconductor device comprising a logic circuit embedded DRAM cell part.

Figure 8:
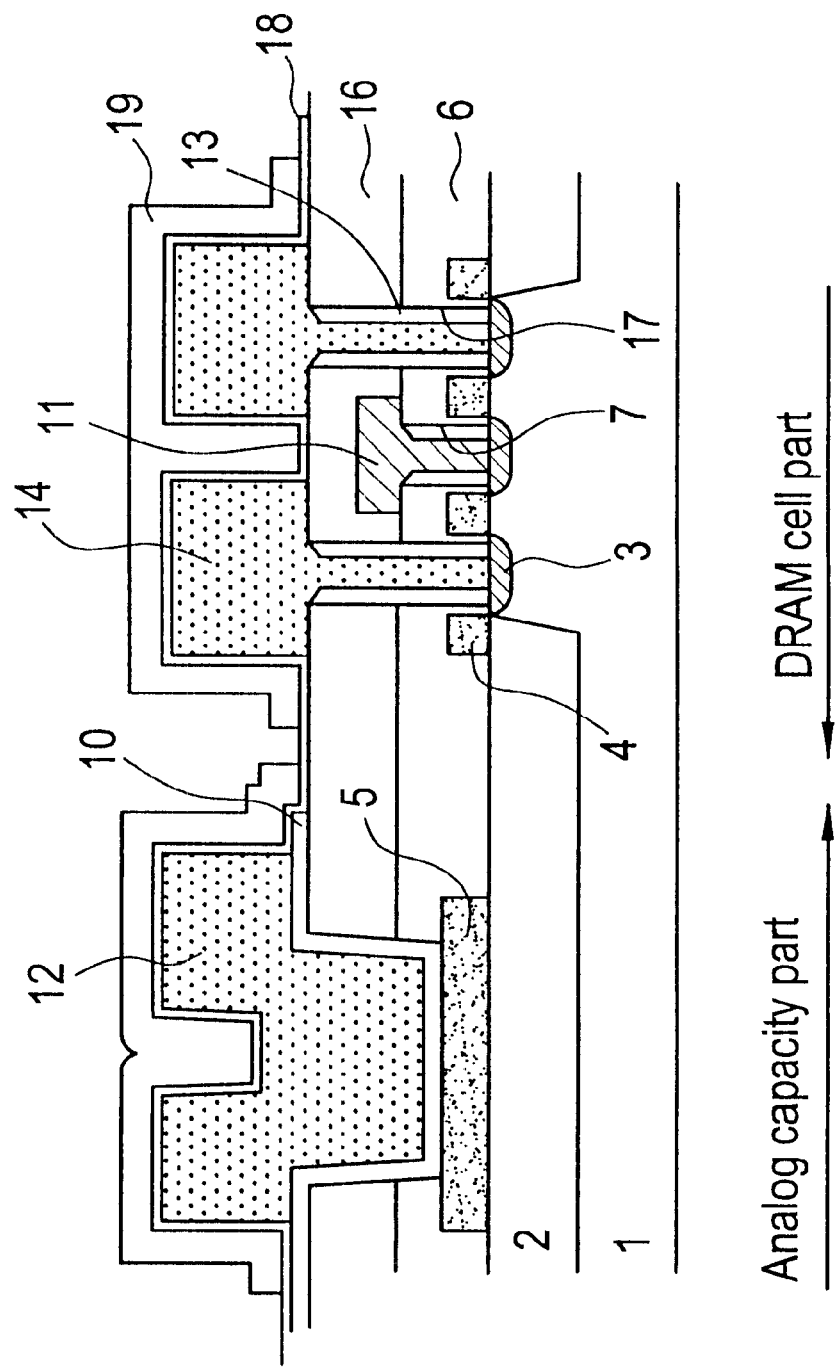
FIG. 8 is a schematic cross partial diagram that illustrates a first embodiment of the configuration of a semiconductor device in accordance with the present invention, showing a partial configuration thereof at the time of the formation of analog capacity element has finished.

FIG. 8 is a schematic diagram of a first embodiment of the configuration of a semiconductor device of the present invention. The semiconductor device of the present invention has a logic circuit embedded DRAM cell part as a main structural part and an analog capacity element part is formed on the same substrate as that of the DRAM cell part. In such a configuration shown in FIG. 8, both the DRAM cell part and the analog capacity element part are schematically illustrated for the purpose of simply indicating the configuration of the present invention.

Figure 9:
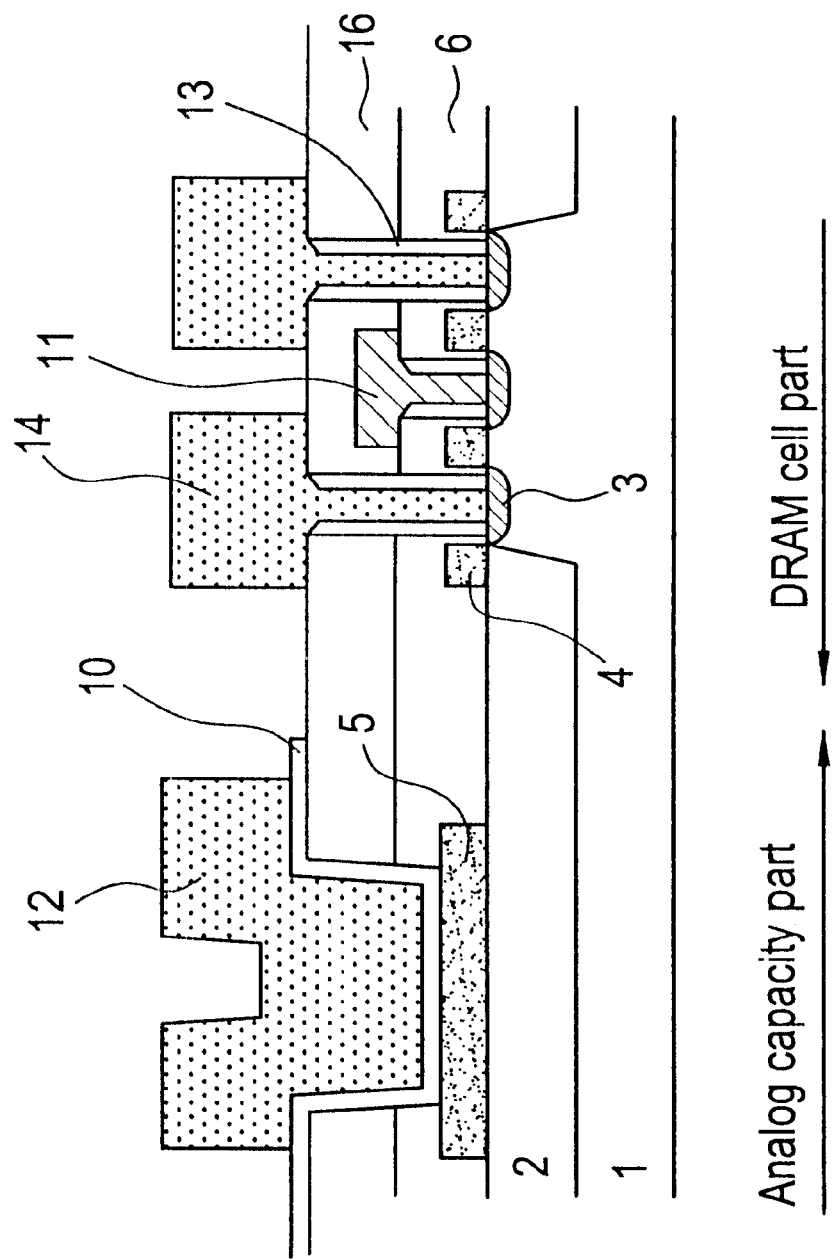
FIG. 9 is a schematic cross partial diagram that illustrates a manufacturing of the first embodiment shown in FIG. 9.

In this embodiment, as shown in FIG. 9, an insulation material layer to be used for a dielectric film 10 of an analog capacity element is also used as side-wall insulation film 13 of a capacitor connection hole 17 where a contact is formed so as to make an electrical connection between a drain region and an accumulation electrode 14 formed on a second interlayer insulation film 16. The capacitor connection hole 17 passes through both the second interlayer insulation film 16 and the interlayer insulation film 16, so that the depth thereof is significantly larger than that of the connection hole 7 that is for a bit line 11. In addition, a difference in level of an opening 17a leading to the lower electrode 5 where a dielectric film 10 of the analog capacity element is formed comparatively large.

From the points of the integrity of covering the side wall of the capacitor connection hole 17 and the uniformity of the thickness of a film on the side wall of an opening 17a formed on the lower electrode 5, an insulation material film 10 formed by an isotropic vapor phase epitaxy, such as a silicon oxide film, a silicon nitride film, a stacked structure consisting of a silicon oxide film and a silicon nitride film, or the like, may be preferably used. After the formation of an accumulation electrode 14, furthermore, a dielectric film 18 and an cell plate 19 are formed. Therefore, a capacitor of a DRAM cell part is formed as shown in FIG. 8.

Figure 10:
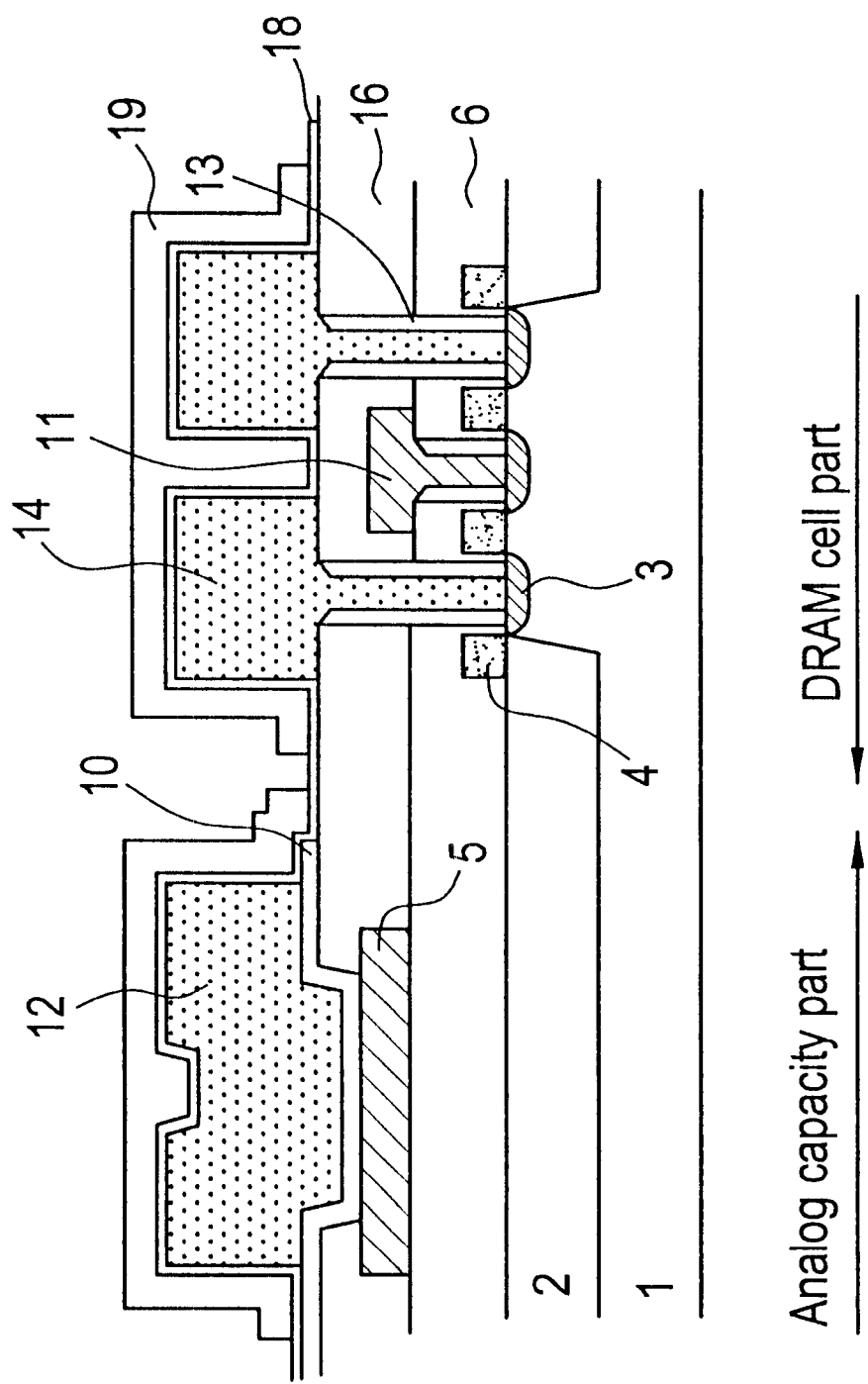
FIG. 10 is a schematic cross partial diagram that illustrates a second embodiment of the configuration of a semiconductor device in accordance with the present invention, showing a partial configuration thereof at the time of the formation of analog capacity element has finished.
Figure 11:
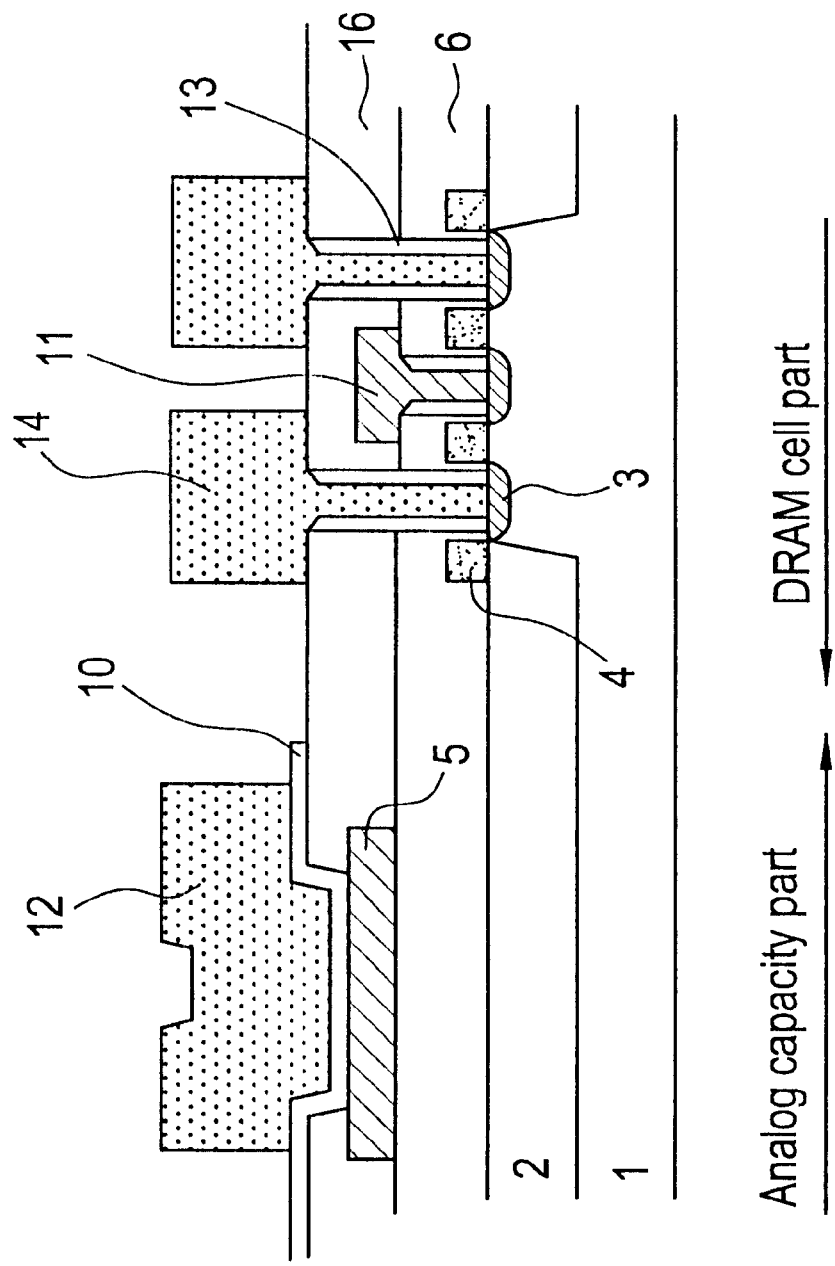
FIG. 11 is a schematic cross partial diagram that illustrates a manufacturing of the second embodiment shown in FIG. 10.

FIG. 10 is a schematic diagram of a second embodiment of the semiconductor device of the present invention. In this embodiment, as shown in FIG. 11, an insulation material layer to be used for a dielectric film 10 of an analog capacity element is also used as side-wall insulation film 13 of a capacitor connection hole 17 where a contact is formed so as to make an electrical connection between a drain region and an accumulation electrode 14 formed on a second interlayer insulation film 16. The capacitor connection hole 17 passes through both the second interlayer insulation film 16 and the interlayer insulation film 6, so that the depth thereof is significantly larger than that of the connection hole 7 that is for a bit line 11.

From the points of the integrity of covering the side wall of the capacitor connection hole 17 and the uniformity of the thickness of a film on the side wall of an opening 17a formed on the lower electrode, an insulation material film 10 formed by an isotropic vapor phase epitaxy, such as a silicon oxide film, a silicon nitride film, a stacked structure consisting of a silicon oxide film and a silicon nitride film, or the like, may be preferably used. After the forming the accumulation electrode 14, furthermore, a dielectric film 18 and an cell plate 19 are formed. Therefore a capacitor of a DRAM cell part is formed as shown in FIG. 10.

In this second embodiment, a lower electrode 5 of an analog capacity element uses a second conductive material layer to be used for the formation of its contact with a bit line 11 on an interlayer insulation film 6. Therefore, the steps until the bit line 11 is formed are intrinsically the same as those of the process of manufacturing a DNA without the installation of analog capacity element or the like.

In the first and second embodiments, as shown in FIG. 8 and 10 the dielectric film 18 and the cell plate 19 of DRAM cells are on the upper electrode 12 of the analog element. That is because the upper electrode 12 of the analog element and the cell plate 19 of DRAM cells are made of the same material, that is polysilicon and it is difficult to remove selectively the cell plate 19 of DRAM while the upper electrode 12 remains. The conductive insulating film 18 is too thin to act as an etching stopper layer. As a result, after forming an interlayer insulating film an the entire surface, it is not able to form a contact hole to that upper electrode 12 of the analog element because the condition of the etching is suited for etching insulating film while the polysilicon film which is the upper electrode 12 remains. In addition, the etching to form that upper electrode 12 is conducted at the same time that an etching to form a contact hole to Si substrate. The next embodiment solves the problem of a low reliability of the contact hole to the upper electrode 12 of the analog element which has first and second embodiments.

Figure 12:
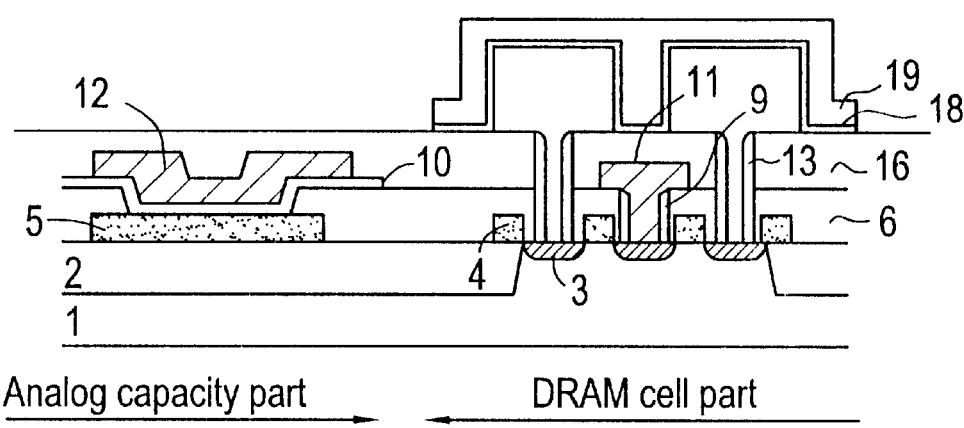
FIG. 12 is a cross partial diagram that schematically illustrates a third embodiment of the configuration of a semiconductor device in accordance with the present invention, showing a partial configuration thereof at the time of the formation of analog capacity element has finished.

FIG. 12 is a schematic diagram that illustrates a third embodiment the configuration of semiconductor device in accordance with the present invention. In the third embodiment, an insulation material to be used for a dielectric film 10 of an analog capacity element is also utilized in a side-wall insulation film 9 that covers a side wall of a connection hole 7 of an interlayer insulating film 6 for providing a contact of a hit line to be formed on a source electrode of the DRAM cell part MOSFET.

Figure 13:
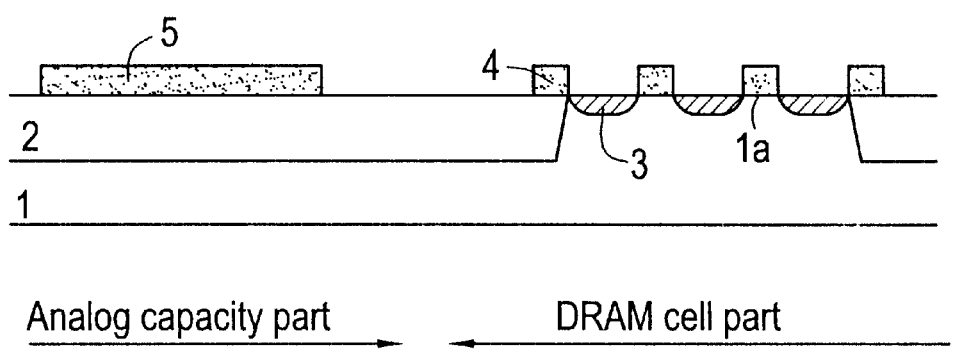
FIG. 13 is a schematic cross partial diagram that illustrates the step of forming a lower electrode of the analog capacity element in the first example of the configuration of the semiconductor device of the present invention shown in FIG. 12.

The step of forming a lower electrode 5 of the analog capacity element is illustrated in FIG. 13. The analog capacity element is formed on an element separation oxide film) 2 that separates between MOSFET elements on a substrate. In this embodiment, the element separation (oxide film) 2 is formed so as to be imbedded in a Si substrate 1 and subjected to a chemical mechanical grinding to form a flat surface to the Si substrate 1. A gate insulation film 1a of the MOSFET is formed as one having a predetermined thickness, on which a first conductive material layer to be used as a gate electrode 4 is layered. The first conductive material layer is etched using a etching mask being patterned to produce a gate electrode 4 and a lower electrode 5 of the analog capacity element in their respective predetermined forms. For both sides of the gate electrode 4, for example, an ion of n-type impurity, such as phosphorous, is ion-implanted and subjected to an activating heat treatment to form a diffusion layer region 3 to be used as a source region and a drain region. For the first conductive material layer described above, for example, polysilicon to be generally used for the gate is used. The under electrode 5 of the analog capacity element which uses the same first conductive material layer as that of the gate electrode 4 is subjected to an ion-implantation with an ion of n-type impurity to form a region of high-concentrated n-type impurity on the surface.

Figure 14:
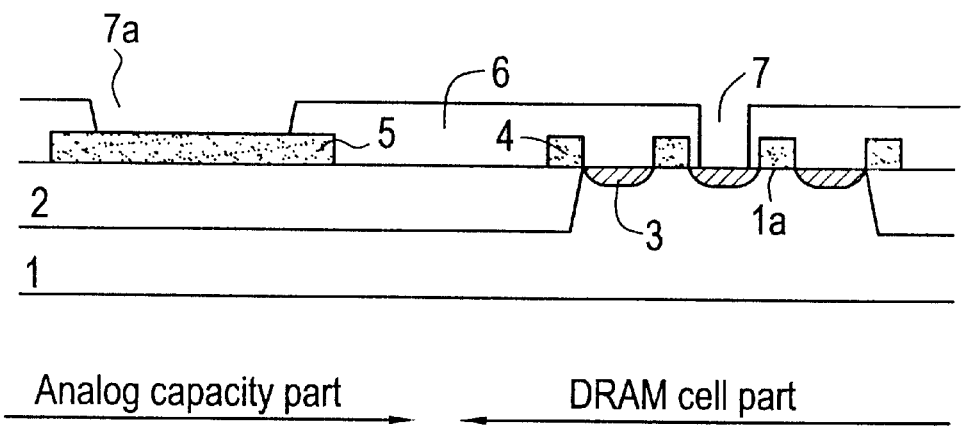
FIG. 14 is a schematic cross partial diagram that illustrates the step of forming an opening for layering a dielectric film on an interlayer insulation film that covers the lower electrode of the analog capacity element in the first example of the configuration of the semiconductor device of the present invention shown in FIG. 12.

FIG. 14 illustrates the steps of forming an interlayer insulation film 6 that covers the lower electrode 5 of the analog capacity element and forming an opening on the interlayer insulation film 6. In the DRAM cell part, an interlayer insulation film 6 with a thickness enough to temporary cover the gate electrode 4 for the purpose of forming a bit line 11. The under electrode 4 is also covered with the interlayer insulation film 6 just as in the case with the gate electrode 5. Then, a connecting hole 7, which reaches the source region (one of the diffusion layer region 3) and an opening 7a which reaches a predetermined area of the lower electrode 5 is formed.

Figure 15:
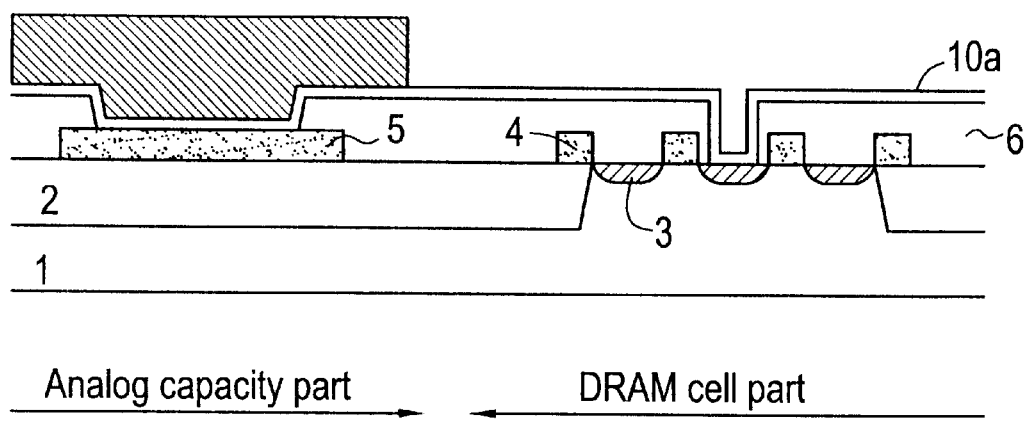
FIG. 15 is a schematic cross partial diagram that illustrates the step of forming an etching mask when the dielectric film of the stacked analog capacity element is formed into the predetermined form by the etching process in the first example of the configuration of the semiconductor device of the present invention shown in FIG. 12.

FIG. 15 illustrates the steps of forming an insulation material film 10a as a dielectric film of the analog capacity element and providing an etching mask in the predetermined form. After forming the opening 7a described above, an insulation material film 10a to be used as the dielectric film of the analog capacity element is deposited on the interlayer insulation film 6. At this time, a sidewall and a bottom of the connection hole 7 formed on the source region is also covered with the insulation material film 10a described above. Then, a resist pattern 8 is formed so as to become an etching mask fit to the predetermined form of the dielectric film 10 of the analog capacity element.

Figure 16:
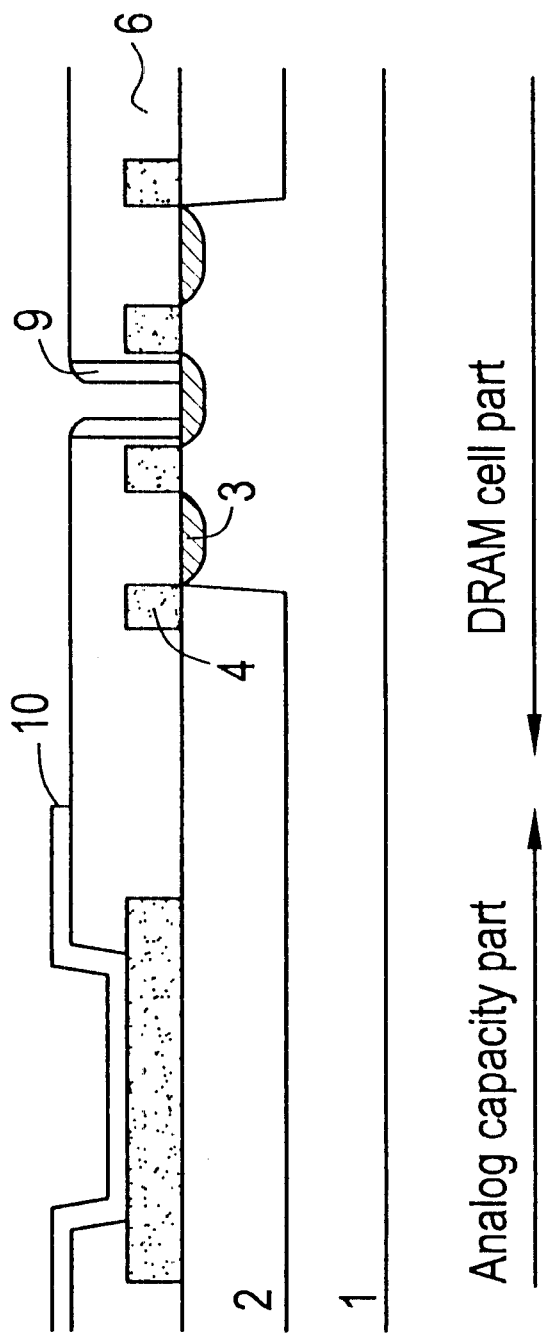
FIG. 16 is a schematic cross partial diagram that illustrates the form of the analog capacity element after peeling off the etching mask after the step of forming an etching mask when the dielectric film of the stacked analog capacity element is formed into the predetermined form by the etching process in the first example of the configuration of the semiconductor device of the present invention shown in FIG. 12.

FIG. 16 illustrates the step of forming an analog capacity element dielectric film 10 in the predetermined form by means of etching. A substrate's surface are etched and also etching is performed in a vertical direction using a highly anisotropic etching means with the resist pattern 8 as a mask to remove the insulation material film 10a on the interlayer insulation film 6. Simultaneously, the insulation material film 10a being deposited on the bottom of the connection hole 7 is also removed. The highly anisotropic etching means is used, so that parts of the insulation material film 10a on the substrate's surface and the vertical sidewall of the connection hole 7 are remained. The insulation material film being remained on the sidewall is used as a sidewall insulation film 9 of the connection hole 7. The resist pattern is peeled off and the surface of the substrate is washed.

Subsequently, a contact for making an electrical connection between a source region and a bit line 11 formed on the interlayer insulation film 6 is formed in the connection hole 7. For example, a doped polysilicon is deposited by a predetermined thickness, and then a tungsten silicide that makes up the top layer of the pit line 11 is layered by a predetermined thickness and a combination of the coped polysilicon and a tungsten silicide is called a second conductive material layer. The second conductive material layer to be used in the contact and the bit line 11 is layered not only on the interlayer insulation film 6 but also on the dielectric film 10 of the analog capacity element.

Figure 17:
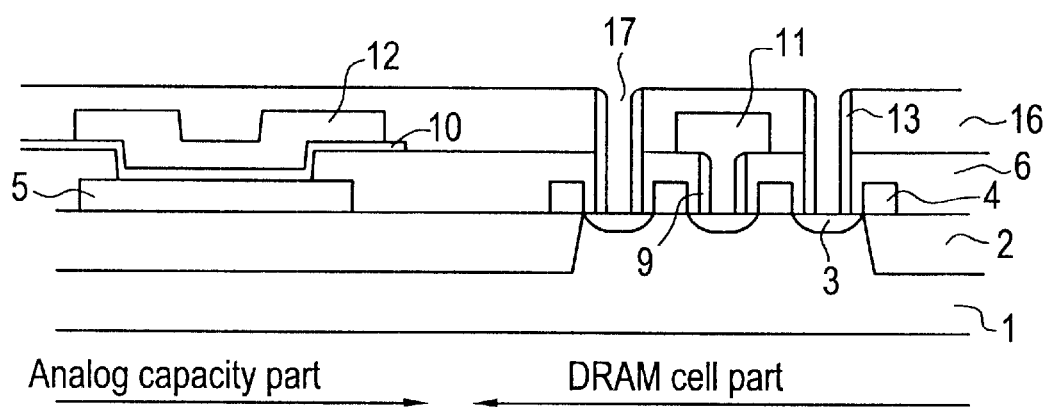
FIG. 17 illustrates a process diagram showing a manufacture method of the memory cell of the present invention after FIG. 16.

As shown in FIG. 17, subsequently, the second conductive material layer is subjected to the patterning using a technique of photolithography to form the bit line 11 in the predetermined form and the upper electrode 12 of the analog capacity element, where the latter is formed on the dielectric film 10.

Figure 18:
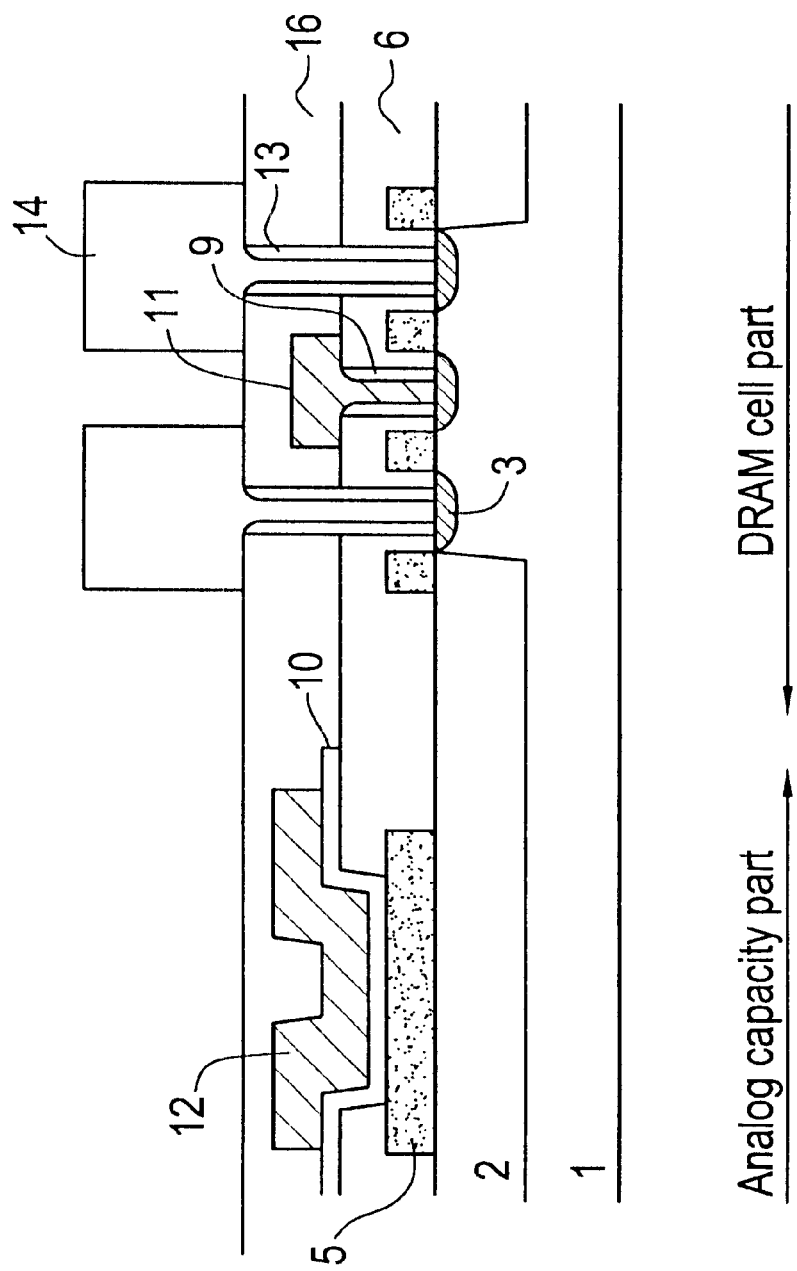
FIG. 18 illustrates a process diagram showing a manufacture method of the memory cell of the present invention after FIG. 17.

After that, a second interlayer insulation film 16 that covers the upper electrode 12 of the analog capacity element and the bit line 11. Then, as shown in FIG. 18, a capacity connection hall 17, a sidewall 13, and a contact, and an accumulation electrode 14 are formed. Furthermore, a capacitor of the DRAM cell in diagram is fabricated as shown in FIG. 12. Following the subsequent steps of forming the second insulation film, we may perform the steps to be adapted to manufacture the conventional semiconductor device.

As described above, the insulation material film used for the dielectric film of the analog capacity element is used for the side-wall 9 insulation film of the connection hole 7 that forms the contact for making an electrical connection between the source electrode and the bit line formed on the interlayer insulation film 6, so that it becomes possible to install the analog capacity element without a substantial increase in the number of the steps. There is a need to cover a sidewall of the connection hole 7 perpendicular to the substrate's surface by the insulation material film to be used for the dielectric film 10 of the analog capacity element. Thus, an insulation material film may be preferably the one formed by an isotropic vapor phase epitaxy, such as a silicon oxide film, a silicon nitride film, a stacked structure consisting of a silicon oxide film and a silicon nitride film, or the like. The insulation material film to be prepared by the above isotropic vapor phase epitaxy is preferable because it can be layered with a uniform thickness thereof on the lower electrode of the analog capacity element and the opening of the interlayer insulation film.

Figure 2:
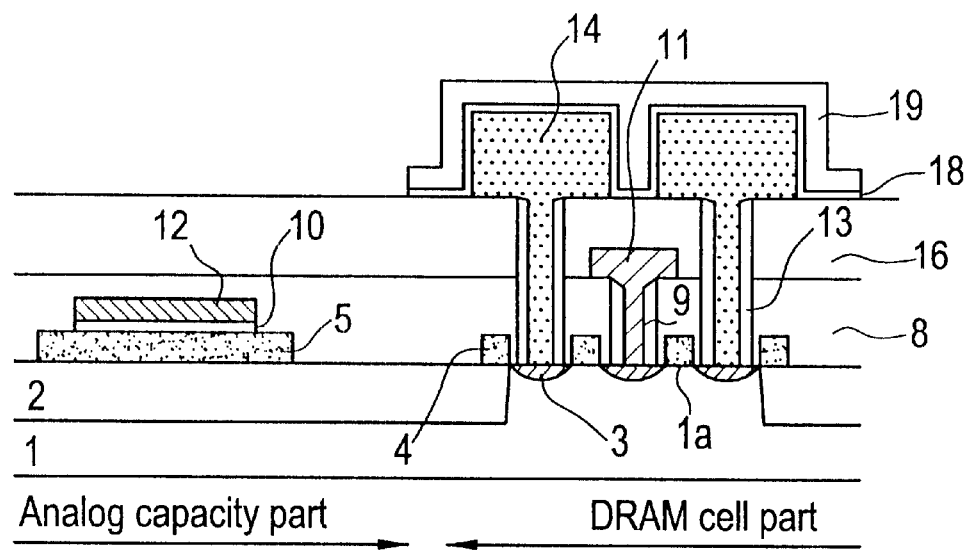
FIG. 2 is a cross partial diagram that schematically illustrates an example the configuration of a semiconductor device where the conventional analog capacity element is manufactured by the alternative steps.
Figure 3:
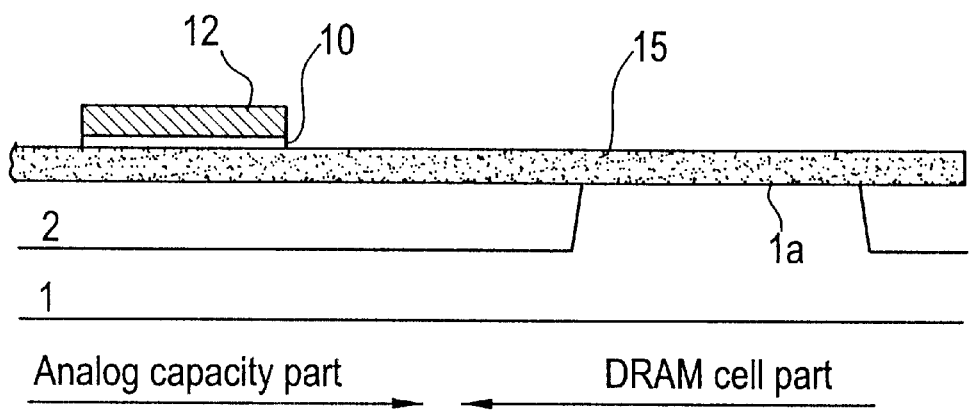
FIG. 3 is a schematic cross partial view that illustrates the step of forming a dielectric film and an upper electrode in the example of the configuration of the conventional semiconductor device shown in FIG. 2.
Figure 4:
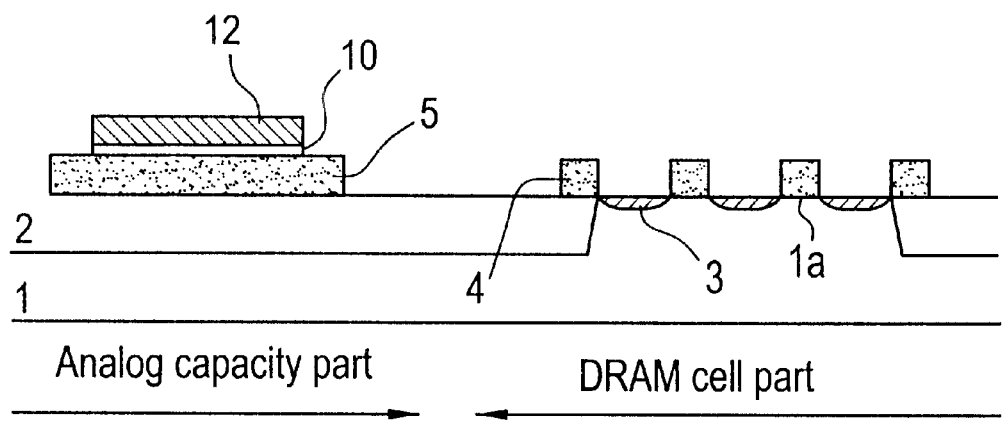
FIG. 4 is a schematic cross partial diagram that illustrates the steps of patterning a gate electrode and a lower electrode and forming a diffusion layer region by means of ion-implantation in the example of the configuration of the conventional semiconductor device shown in FIG. 2.
Figure 5:
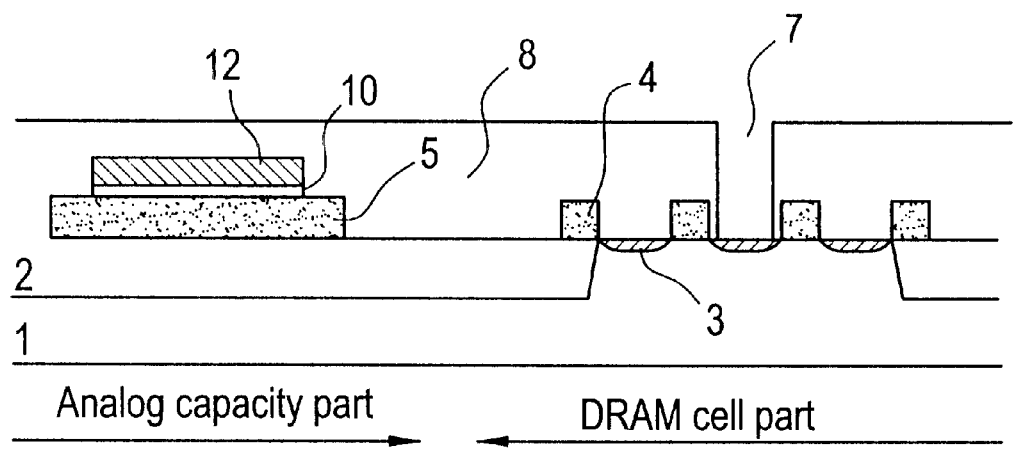
FIG. 5 is a schematic cross partial diagram that illustrates the steps of forming an interlayer insulation film and forming a connection hole in the example of the configuration of the conventional semiconductor device shown in FIG. 2.

Furthermore, in the conventional configuration shown in FIG. 2, as shown in FIG. 3, the dielectric film 10 and the upper electrode 12 of the analog capacity element are formed on the gate polysilicon film 15 provided as the first conductive material layer when the gate electrode is formed using the patterning. This analog capacity element part is provided as a protrusion on the gate polysilicon film 15, so that its flatness is impaired and the difficulty of micro-patterning of the gate electrode 4 and the lower electrode 5 may be further increased. According to the present invention, on the other hand, the patterning is performed just after the lamination of the gate polysilicon film 15 with a high flatness, so that the micro-patterning can be favorably performed without difficulty.

It is preferable that the same conductive material layer used for the gate electrode of DRAM cell part MOSFET and the under electrode of the analog capacity element is constructed so as to be include a doped polysilicon film.

Furthermore, in any of these configurations, the element separation is an insulation region made of silicon oxide. Preferably, a surface of the region is flattened so that the height thereof is substantially at the same level as that of the substrate's surface. It is also preferable that the conductive material layer used for the upper electrode of the analog capacity element comprises a layer of doped polysilicon film.

In the present embodiment, the cell plate 19 and a dielectric film 18 above the upper electrode 12 is able to be selectively removed while the upper electrode 12 remains. Therefore it is able to form a contact hole to the upper electrode 12 in an interlayer insulating film formed after patterning the cell plate 19 because there is not the cell plate 19 above the upper electrode 12.

In the semiconductor device of the present invention, furthermore, a material, a thickness, and so on of each of the interlayer insulation film 6 and the second interlayer insulation film 16 are in common with those of used for the typical DNA cell part. Therefore, the steps of forming the connection hole 7 and the capacitor connection hole 17 on the interlayer insulation film 6 and the second interlayer insulation film 16, respectively, the steps of forming contacts in the connection hole 7 and the capacitor connection hole 17, respectively, and so on are also in common with those of used for the typical DNA cell part. The conventional configuration shown in FIG. 9, more concretely, the thickness of the interlayer insulation film is larger than that of the typical DRAM cell part when the covering with the interlayer insulation film is performed after the formation of the analog capacity element. In the semiconductor device of the present invention, on the other hand, it can be substantially the same thickness as that of the typical DRAM cell part. In addition, there is no need to increase the depth of each of the connection hole 7 and the capacitor connection hole 17, and also the improvements of process technology, such as the increase in process accuracy of the etching for the hole formation and the decrease in resistance of the doped polysilicon layer that forms the contact are not essentially required.

As indicated in the above examples being applied on DRAM, the formation of contact is formed at the time of connecting the conductive material layer on the interlayer insulation film, i.e., electrode or wiring, to be formed on the interlayer insulation film with the electrode layer or the like. On that occasion, for the purpose of ensuring the insulation separation in the contact hole, the covering of sidewall insulation film is performed when another conductive material layer has already formed under the interlayer insulation layer. In the configuration of the present invention, the analog capacity element is constructed using two conductive material layer to be independently formed on the upper and lower sides of the interlayer insulation film and the side-wall insulation film that covers the contact hole. Therefore, it can be a means to be generally used not only in the above example applied on DRAM but also to the semiconductor device that requires the covering of the side-wall insulation film on the side-wall of the contact hole or preferably the covering of the side-wall insulating film in terms of the characteristics of the device. In addition, the insulation material is useful for the dielectric film of the analog capacity element without indicating the voltage dependency.

EXAMPLES

In the following more concretely, the semiconductor device of the present invention and its manufacturing process will be described in detail. These concrete examples are preferable embodiments of the present invention. However, the present invention is not limited to these examples.

Example 1

Example 1 is a semiconductor device with a first example of the configuration of the present invention shown in FIG. 8.

An under electrode 5 of the analog capacity element is made of the same material as that of a gate electrode of DRAM cell part MOSFET. In addition, a dielectric film 10 of the capacity element is made of the same material as that of a sidewall insulation film 13 of a contact hole (capacitor connection hole 17) for an accumulation electrode to be formed on the DRAM cell part. Then, an upper electrode 12 of the capacity element is made of the same material as that of the accumulation electrode 14 on the DRAM cell part.

After the formation of the bit line 11, a second interlayer insulation film 16 of about 50 nm in thickness, for example, is layered. A technology of photolithography is used to form a capacitor connection hole 7 for making an electrical connection between the accumulation electrode 14 and the diffusion layer region 3 under the accumulation electrode 14. The depth of the capacitor connection hole 7 passing through the interlayer insulation film 6 and the second interlayer insulation film 16 is about 1,000 nm. Simultaneously, an opening is formed on a lower electrode 5 of the analog capacity element.

A silicon oxide film is formed on the whole surface at first to ensure a contact margin (insulation) between the gate electrode 4 and the capacitor connection hole 17. Subsequently, a resist pattern is formed on the predetermined position corresponding to the lower electrode 5 of the analog capacity element and then the silicon oxide film is subjected to the etching.

Accordingly, a side-wall insulation film having a thickness of about 50 nm is remained in the capacitor connection hole 17 and also a dielectric film 10 having a thickness of about 50 nm is remained on the lower electrode 5 of the analog capacity element.

Figure 6:
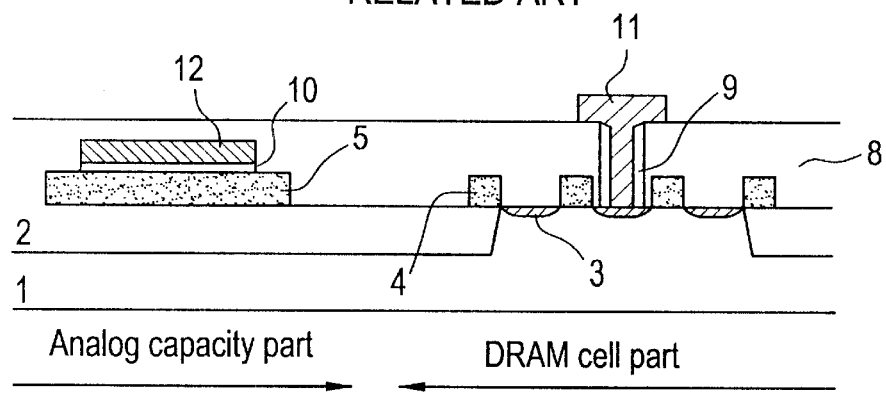
FIG. 6 is a schematic cross partial diagram that illustrates the steps of forming a side-wall insulation film on a side wall of connection hole and forming a bit line in the example of the configuration of the conventional semiconductor device shown in FIG. 2.
Figure 7:
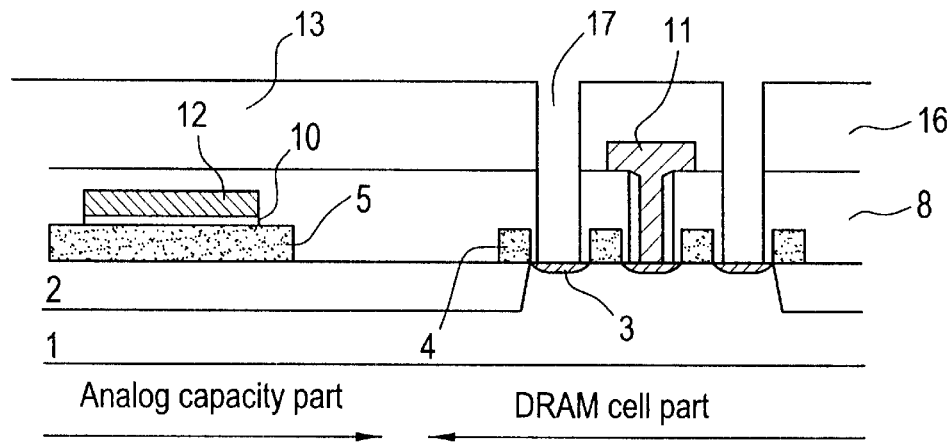
FIG. 7 is a schematic cross partial diagram that illustrates the steps of forming a second interlayer insulation film and forming a capacitor connection hole in the example of the configuration of the conventional semiconductor device shown in FIG. 2.

A doped polysilicon film having a thickness of about 100 nm and a tungsten siliside film having a thickness of about 100 nm, for example, are formed on the whole surface. The doped polysilicon is imbedded in the bottom of the capacitor connection hole 17. Subsequently, the accumulate electrode 14 and the upper electrode 12 of the analog capacity element are formed by the patterning using a technology of photolithography, resulting in the structure shown in FIG. 6.

Example 2

Example 2 is a semiconductor device with a third example of the configuration of the present invention shown in FIG. 10.

An under electrode 5 of the analog capacity element is made of the same material as that of a gate electrode of DRAM cell part MOSFET. In addition, a dielectric film 10 of the capacity element is made of the same material as that of a sidewall insulation film 13 of a contact hole (capacitor connection hole 17) for an accumulation electrode to be formed on the DRAM cell part. Then, an upper electrode 12 of the capacity element is made of the same material as that of the accumulation electrode 14 on the DRAM cell part.

After the formation of a side-wall insulation film 9 on the connection hole 7, a doped polysilicon film having a thickness of about 100 nm and a tungsten siliside film having a thickness of about 100 nm, for example, are formed on the whole surface. The doped polysilicon is imbedded in the bottom of the connection hole 7. Subsequently, the bit line 11 and the upper electrode 12 of the analog capacity element are formed by the patterning using a technology of photolithography, resulting in the structure shown in FIG. 10.

Example 2

Example 2 is a semiconductor device with a third configuration of the present invention shown in FIG. 12. The semiconductor device comprises an analog capacity element part and a logic circuit embedded DRAM cell part. For making clear the characteristics of the device with respect to its structure and its manufacturing steps, we will restrict our explanation to the analog capacity element part and a logic circuit embedded DRAM cell part.

An under electrode 5 of the analog capacity element is made of the same material as that of a gate electrode of DRAM cell part MOSFET. In addition, a dielectric film 10 of the capacity element is made of the same material as that of a sidewall insulation film 9 of a contact hole (connection hole 7) for a bit line to be formed on the DRAM cell part. Then, an upper electrode 12 of the capacity element is made of the same material as that of a bit line 11 on the DRAM cell part.

Next, the steps for obtaining the structure of Example 3 will be explained on the basis of FIGS. 13 to 18. At first, as shown in FIG. 2, a gate insulation film with a thickness of 7 nm for example, and a gate electrode 4 having a thickness of about 150 nm, and a lower electrode 5 of the capacity element are formed on a silicon separation oxide film 2. A diffusion layer region 3 is formed using the gate electrode 4 as a mask, for example, by the ion injection of phosphorous.

Next, as shown in FIG. 14, an interlayer insulation film 6 is formed on the whole surface so as to obtain the film with a high of about 40 nm with reference to the diffusion layer region 3 (substrate's surface). Therefore, the gate electrode 4 is covered with the interlayer insulation film 6 so that the height there becomes about 250 nm. Using the technology of photolithography, a connection hole 7 for obtaining an electrical connection between the bit line 11 and the diffusion layer region 3 provided on the under layer by a technology of photolithography. The depth of the connection hole 7 passing through the interlayer insulation film 6 is about 400nm. In addition, concurrently, an opening is formed on a lower electrode 5 of the analog capacity element.

A silicon oxide film is formed on the whole surface at first to ensure a contact margin (insulation) between the gate electrode 4 and the connection hole 7. Subsequently, as shown in FIG. 15, a resist pattern is formed on the predetermined position corresponding to the lower electrode 5 of the analog capacity element and then the silicon oxide film is subjected to the etching.

Accordingly, as shown in FIG. 16, a side-wall insulation film having a thickness of about 50 nm is remained in the connection hole 7 and also a dielectric film 10 having a thickness of about 50 nm is remained on the lower electrode 5 of the analog capacity element.

A doped polysilicon film having a thickness of about 100 nm and a tungsten siliside film having a thickness of about 100 nm, for example, are formed on the whole surface. The doped polysilicon is imbedded in the bottom of the connection hole 7. Subsequently, the bit line 11 and the upper electrode 12 of the analog capacity element are formed by the patterning using a technology of photolithography. After that, a second interlayer insulation film 16 is formed on the entire surface of the substrate and a capacity connection hall 17 and a side-wall 13 is formed as shown in FIG. 17. Furthermore an accumulation electrode 14 is formed as shown in FIG. 18 and a dielectric film 18 and an cell plate 19 are formed as shown in FIG. 12, resulting in the structure shown in FIG. 1.

In this example, the dielectric film 10 is provided as a silicon oxide film. However, for example, a silicon nitride film may be also used because of the dependency on the sidewall insulation film 9. Alternatively, the configuration using a stacked structure consisting of both the silicon oxide film and the silicon nitride film (it is not problem whichever is on the top).

For example, some DRAM-consolidated logic products require the formation of a capacity element with less applied-voltage dependency. Conventionally, the process including the steps of forming a lower electrode and a gate electrode on the same layer and then additionally forming a dielectric film and an upper electrode thereon. In the semiconductor device of the present invention, a dielectric film to be used for a capacity element having a less applied-voltage dependency is also used for a side-wall insulation film of a connection hole or the like to be used in the process for DTRAM, while a conductive material layer to be used for a bit line of DRAM or an accumulation electrode for DRAM cell capacitor are used for an upper electrode. Comparing with the general process for DRAM, therefore, the conventional process further includes additional steps of making a dielectric film and a film of upper electrode and patterning the dielectric film and the upper electrode. If the configuration of the semiconductor device of the present invention is adopted, on the other hand, there is no substantial increase in the number of the steps for forming a material layer to be used for the dielectric film and the upper electrode. In addition, there is no need to provide the step of patterning the dielectric film and the upper electrode and there is no substantial increase in the number of steps. Additionally, there is no substantial increase in the manufacturing cost, so that the installation of capacity element can be realized. According to the present invention, furthermore, for example, there is no need to increase the thickness of the interlayer insulation film so as to cover the upper electrode when the interlayer insulation film is formed. Thus, the process itself does not changed in comparison with the general DRAM cell part. Consequently, for example, the depth of the connection hole for making an electrical connection between the diffusion layer region and the bit line does not become deeper, so that a low resistance and a stable contact resistance can be obtained just as in the case of the general DRAM cell part. The resulting semiconductor device is provided as a device that keeps its performance and reliability at a high level compared favorably with the semiconductor device without having an analog capacity element.

It is apparent that the present invention is not limited to the above embodiments, but may be modified and changed without departing from the scope and spirit of the invention.

What is claimed is:

1. A semiconductor device comprising:
    a capacitance including a lower electrode, a dielectric film and an upper electrode;
    an interlayer insulation film on said lower electrode which has an opening to expose said lower electrode;
    wherein said dielectric film is formed on said lower electrode and a side wall of said interlayer insulation film opening;
    a first wiring which is made of the same material that said lower electrode is made of and is covered with said interlayer insulation film;
    a connection hole penetrating said interlayer insulation film;
    a second wiring which is made of the same material that said upper electrode is made of and is electrically connected with a substrate through said connection hole; and
    a side wall of said connection hole made of the same material as said dielectric film.

2. The semiconductor device as claimed in claim 1, wherein said first wiring is a gate electrode of a DRAM cell, and said second wiring is a storage node of said DRAM cell.

3. The semiconductor device as claimed in claim 2 further comprising,
    a bit line of said DRAM cell, wherein said interlayer insulation film consists of a first interlayer insulation film and second interlayer insulation film, and said bit line is provided on said first interlayer insulation film.

4. The semiconductor device as claimed in claim 1, wherein said first wiring is a bit electrode of a DRAM cell, and said second wiring is a storage node of said DRAM cell.

5. The semiconductor device as claimed in claim 4 further comprising,
    a gate electrode of said DRAM cell, wherein said lower electrode is provided on a lower interlayer insulation film which covers said gate electrode.

6. The semiconductor device as claimed in claim 1, wherein said first wiring is a gctc electrode of a DRAM cell, and said second wiring is a bit line of said DRAM cell.

7. The semiconductor device as claimed in claim 6 further comprising,
    an upper interlayer insulation film on said upper electrode and said bit line,
    a contact hole penetrating said upper interlayer insulation film and said interlayer insulation film, and
    a storage node of said DRAM contacting with said substrate through said contact hole.

* * * * *